United States Patent
Kecskemeti et al.

(10) Patent No.: US 9,366,740 B2
(45) Date of Patent: Jun. 14, 2016

(54) SYSTEM AND METHOD FOR VASTLY UNDERSAMPLED ISOTROPIC PROJECTION RECONSTRUCTION WITH INVERSION RECOVERY

(71) Applicant: Wisconsin Alumni Research Foundation, Madison, WI (US)

(72) Inventors: Steven Ryan Kecskemeti, Madison, WI (US); Andrew L. Alexander, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 735 days.

(21) Appl. No.: 13/829,260

(22) Filed: Mar. 14, 2013

(65) Prior Publication Data
US 2014/0266193 A1    Sep. 18, 2014

(51) Int. Cl.
*G01R 33/56*    (2006.01)
*G01R 33/48*    (2006.01)

(52) U.S. Cl.
CPC ........ *G01R 33/5602* (2013.01); *G01R 33/4824* (2013.01)

(58) Field of Classification Search
CPC .................. G01R 33/4824; G01R 33/5602
See application file for complete search history.

(56) References Cited

U.S. PATENT DOCUMENTS

| | | | | |
|---|---|---|---|---|
| 6,476,607 B1* | 11/2002 | Dannels | ............. | G01R 33/4824 324/307 |
| 8,112,145 B2* | 2/2012 | Grist | .................. | G01R 33/5673 324/309 |
| 8,441,257 B2* | 5/2013 | Mordini | ........... | G01R 33/56325 324/309 |
| 9,002,430 B2* | 4/2015 | Riederer | ....................... | 600/419 |
| 9,140,771 B2* | 9/2015 | Carroll | ............... | G01R 33/5616 |

* cited by examiner

*Primary Examiner* — Dixomara Vargas
(74) *Attorney, Agent, or Firm* — Quarles & Brady, LLP

(57) ABSTRACT

Described here are a system and method for obtaining a time series of images that depict a subject using an inversion recovery ("IR") pulse sequence with a unique data acquisition scheme that allows for the retrospective identification of an image having an optimal tissue contrast. Data acquisition is performed using a radial acquisition scheme such as, preferably, a vastly undersampled isotropic projection reconstruction ("VIPR") scheme. Using VIPR and IR, combined with a unique projection ordering, a series of three-dimensional, high spatial resolution images with multiple different image contrasts can be obtained.

16 Claims, 8 Drawing Sheets

—— S₃ 210  ---- S₄ 212  ······· S₅ 214

SYSTEM AND METHOD FOR VASTLY UNDERSAMPLED ISOTROPIC PROJECTION RECONSTRUCTION WITH INVERSION RECOVERY

STATEMENT REGARDING FEDERALLY SPONSORED RESEARCH

This invention was made with government support under MH84051 and HD003352 awarded by the National Institutes of Health. The government has certain rights in the invention.

BACKGROUND OF THE INVENTION

The field of the invention is magnetic resonance imaging systems and methods. More particularly, the invention relates to a system and method for inversion recovery magnetic resonance imaging using radial projections that are ordered in a way that enhanced temporal resolution of the imaging sequence can be achieved.

When a substance such as human tissue is subjected to a uniform magnetic field (polarizing field $B_0$) applied along, for example, a z axis of a Cartesian coordinate system, the individual magnetic moments of the spins in the tissue attempt to align with this polarizing field, but process about it in random order at their characteristic Larmor frequency. If the substance, or tissue, is subjected to a magnetic field (excitation field $B_1$) that is in the x-y plane and that is near the Larmor frequency, the net aligned moment, Mz, may be rotated, or "tipped", into the x-y plane to produce a net transverse magnetic moment $M_t$. A NMR signal is emitted by the excited spins after the excitation signal $B_1$ is terminated, this signal may be received and processed to form an image or produce a spectrum.

The MR signals acquired with an MRI system are signal samples of the subject of the examination in Fourier space, or what is often referred to in the art as "k-space". Typically, a region to be imaged is scanned by a sequence of measurement cycles in which gradients vary according to the particular localization method being used. Each MR measurement cycle, or pulse sequence, typically samples a portion of k-space along a sampling trajectory characteristic of that pulse sequence. This is accomplished by employing magnetic fields ($G_x$, $G_y$, and $G_z$) that have the same direction as the polarizing field $B_0$, but which have a gradient along the respective x, y, and z axes. By controlling the strength of these gradients during each NMR cycle, the spatial distribution of spin excitation can be controlled and the location of the resulting NMR signals can be identified. The acquisition of the NMR signals samples is referred to as sampling k-space, and a scan is completed when enough NMR cycles are performed to adequately sample k-space. The resulting set of received NMR signals are digitized and processed to reconstruct the image using one of many well known reconstruction techniques.

In conventional, fully-sampled MRI, the number of acquired k-space data points is determined by the spatial resolution requirements, and the Nyquist criterion for the alias-free field of view (FOV). Images can be reconstructed, however, using a reduced number of k-space samples, or "undersampling". The term undersampling here indicates that the Nyquist criterion is not satisfied, at least in some regions of k-space. Undersampling is used for several reasons, including reduction of acquisition time, reduction of motion artifacts, achieving higher spatial or temporal resolution, and reducing the tradeoff between spatial resolution and temporal resolution.

As illustrated in FIG. 1A, many common pulse sequences sample k-space in a roster scan-like pattern sometimes referred to as a "spin-warp", a "Fourier", a "rectilinear" or a "Cartesian" scan. The time required to fully sample 3D Cartesian k-space is relatively long. This reduces the temporal resolution of time-resolved studies that acquire the same imaging volume repeatedly. Well-known undersampling methods that are used to improve the temporal resolution of such time-resolved acquisitions often focus on sampling data at the periphery of k-space less frequently than at the center because aliasing artifacts that result from undersampling are not as severe if the violation of the Nyquist criterion is restricted to the outer part of k-space.

To increase the rate at which image frames are acquired, image quality may be sacrificed by acquiring fewer phase encoding views, or by using faster pulse sequences that inherently result in lower quality images. With the spin-warp methods, therefore, there is a trade-off between the number of views that are acquired to achieve the desired image resolution and quality, and the rate at which NMR data for a complete image may be acquired.

Alternatively, MR image data can be acquired without the use of phase encoding gradients. Instead, only a readout gradient is applied during the acquisition of each MR signal (i.e., "view") and a series of different views are acquired by rotating the angle of the readout gradient. Rather than sampling k-space in a rectilinear scan pattern as is done in Fourier imaging and shown in FIG. 1A, this projection reconstruction ("PR") method samples k-space with a series of views that sample radial lines extending outward from the center of k-space, as shown in FIG. 3. The number of views needed to sample k-space determines the length of the scan and if an insufficient number of views are acquired, streak artifacts are produced in the reconstructed image.

To allow data acquisition over a wide time span and still enable an image to be reconstructed that has a high temporal resolution, the data acquisition is performed using a projection reconstruction pulse sequence. As is well known in the art, each PR acquisition samples k-space along a trajectory that extends from the center of k-space and radially outward to the peripheral boundary of k-space as shown in FIG. 1B. As a result, each PR acquisition includes data from both the periphery and the center of k-space. As is well known in the art, it is data from the center of k-space that determines the contrast, or brightness of larger objects, whereas peripheral k-space data defines boundaries of small objects and sharpens edges on all objects.

SUMMARY OF THE INVENTION

The present invention overcomes the aforementioned drawbacks by providing a system and method for inversion-recovery imaging that allows improved flexibility in creating segments of repetition times ("TRs") that sweep a range of inversion times ("TI"). In accordance with the present invention, a user may select a desired number of consecutive projections to be combined to improve image quality and the number of consecutive projections to be combined can be chosen after data acquisition to retrospectively combine data. Furthermore, the set of a desired number of projections can be selectively adjusted by a single TR, allowing the inversion time to still be adjusted by a given, even single, TR. As such, the present invention provides "subject-specific" contrast by offering a range of different contrasts, as opposed to a single contrast as in a typical scan.

It is an aspect of the invention to provide a method for producing an image of a subject with a magnetic resonance imaging ("MRI") system. The method includes selecting a sampling pattern for sampling k-space. The sampling pattern is selected to include a plurality of radial projections in k-space, which may be two-dimensional or three-dimensional radial projections. A view order that defines an order in which radial projections in the selected sampling pattern are to be acquired is also selected. This view order is selected such that any group of consecutively acquired radial projections will sample k-space in a substantially uniform distribution. The MRI system is then directed to apply an inversion recovery ("IR") radio frequency ("RF") pulse to the subject such that net longitudinal magnetization in the subject is substantially inverted and begins to relax back to equilibrium. The MRI system is then directed to acquire k-space data while the net longitudinal magnetization is recovering back to equilibrium by sampling k-space in accordance with the selected sampling pattern and the selected view order. A data segment is then formed by grouping together consecutively acquired radial projections in the acquired k-space data starting with an initial radial projection acquired at an initial time point. An image of the subject is then reconstructed from the formed data segment. This reconstructed image depicts an image contrast defined by the average recovery state of the net longitudinal magnetization at which the radial projections in the data segment were acquired.

It is another aspect of the invention to provide a method for producing a plurality of images that depict a spectrum of different image contrasts using an MRI system. The method includes selecting a sampling pattern for sampling k-space that includes a plurality of radial projections in k-space, which may be two-dimensional or three-dimensional radial projections. A view order is then selected and used to determine a view order that defines the order in which radial projections in the selected sampling pattern are to be acquired. The view order allows for selection of a temporal window when reconstructing images so that any group of consecutively acquired radial projections contained within the temporal window will substantially uniformly sample k-space. The MRI system is then directed to apply an IR RF pulse to the subject such that net longitudinal magnetization in the subject is substantially inverted and begins to relax back to equilibrium. The MRI system is then directed to acquire k-space data while the net longitudinal magnetization is recovering back to equilibrium by sampling k-space in accordance with the selected sampling pattern and the selected view order. The k-space data can be acquired using excitation pulses applied in every TR. A data segment is formed by grouping together consecutively acquired radial projections, e.g., multiple TRs, in the acquired k-space data using the selected temporal window. This step is repeated to form a plurality of data segments while sliding the temporal window by a retrospectively determined time shift during each repetition. A plurality of images that depict a spectrum of different image contrasts are then reconstructed from the formed data segments. The spectrum of different image contrasts is defined by the average recovery state of the net longitudinal magnetization at which the radial projections in the data segment associated with a given image were acquired.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1A:
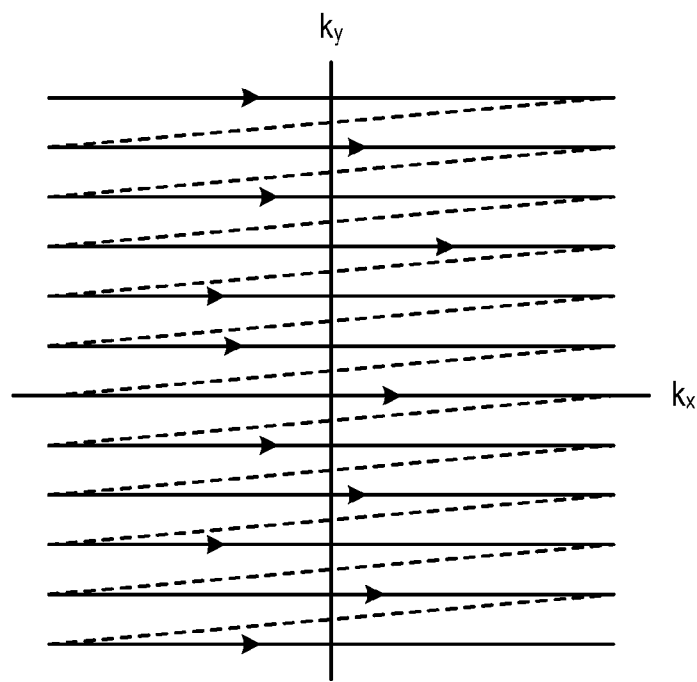
FIG. 1A is a schematic illustration of a Cartesian k-space sampling pattern.

Described here are a system and method for obtaining a time series of images that depict a subject using an inversion recovery ("IR") pulse sequence with a unique data acquisition scheme that allows for the retrospective identification of an image having an optimal tissue contrast. Data acquisition is performed using a radial acquisition scheme such as, preferably, a Vastly Undersampled Isotropic Projection Reconstruction (VIPR) scheme. Using VIPR and IR, combined with a unique projection ordering, allows for the acquisition and reconstruction of a series of three-dimensional, high spatial resolution images with multiple different image contrasts.

By way of example, in one implementation, the method of the present invention is capable of acquiring multiple images (e.g., 160 images) with different contrasts between gray matter and white matter in the same amount of time that it takes to acquire an image with a single contrast setting using conventional techniques available on commercial scanners. The method of the present invention thus has several advantages.

One advantage is that a subject and disease specific optimized image contrast can be achieved. Rather than trying to predict what imaging parameters will produce the best contrast for a particular patient, multiple images across a wide range of contrast settings can be acquired in the same amount of time as a typical scan with other commercially available methods. This can be useful for many different applications, including the following examples.

The method of the present invention allows for advantageous imaging of infants less than twelve months of age. Protocols for T1-weighted (T1W) brain imaging are usually developed to differentiate between typical gray matter (GM) and white matter (WM) in healthy adult brains. These imaging sequences are generally not robust to head movement; therefore, the current T1W imaging methods used when imaging pediatric patients result in sub-optimal image quality, mainly artifacts due to motion artifacts and poor image contrast. It is challenging to extend the current technology for developing brains as they have dramatically different T1s compared to mature adult brains. Furthermore, these T1s change at a rapid and unpredictable rate making it difficult to design an optimized protocol for a wide range of children and diseases. The method of the present invention can improve image quality through the described image acquisition techniques, which are inherently less sensitive to motion, offer the ability to retrospectively remove motion induced artifacts, and provide subject-specific optimized tissue contrast.

The method of the present invention can also be advantageously used to image tumors and brain lesions, such as multiple sclerosis lesions. A characteristic used to monitor the progression and treatment of tumors and brain lesions is their size and shape. Specifically, delineating the boundaries of tumor and lesion edges are important. Since many tumors and lesions are not homogenous, a single contrast setting may not be optimal to properly define the borders. Furthermore, many MR technicians are only trained to identify high contrast between normal white and grey matter, not contrast between healthy and diseased tissues. The method of the present invention can allow radiologists to retrospectively select the best images to make a proper diagnosis.

The method of the present invention can also be advantageously used for T1 quantification. The VIPR-IR method described here samples data along a recovery curve that can be modeled and fitted to match the data. This allows the T1 value, a fundamental parameter describing the brain tissue, to be accurately quantified. Being able to obtain an accurate measurement of T1 opens the door for new biomarkers for classifying and monitoring progression of illnesses and normal development with new tools not currently available on commercial scanners.

Figure 1B:
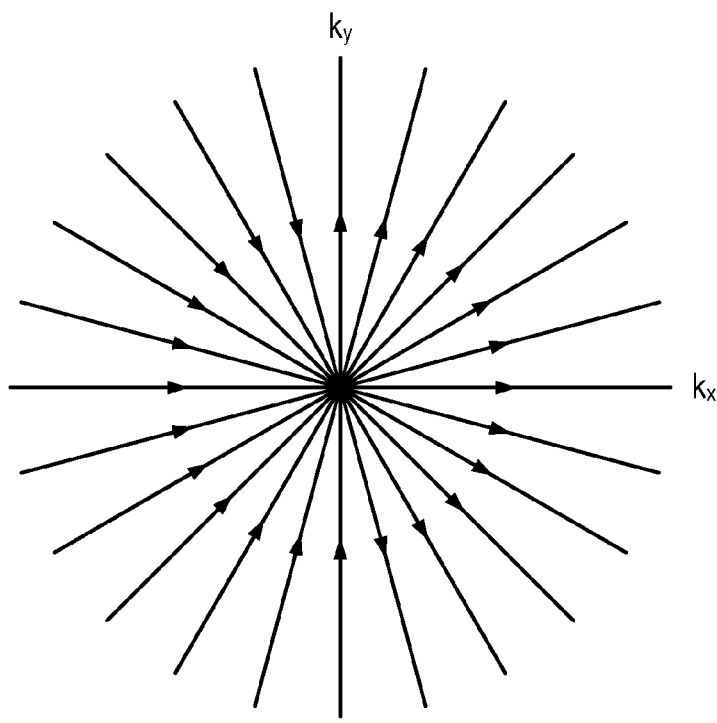
FIG. 1B is a schematic illustration of radial k-space sampling pattern that samples k-space as a series of two-dimensional radial projections.

As described above, one known method for sampling k-space is referred to as projection imaging, which uses projections extending through k-space, such as illustrated in FIG. 1B. One particular PR acquisition is an inversion-recovery (IR) PR acquisition. The IR pulse sequence generally starts with a 180 degree RF inversion pulse that inverts longitudinal magnetization, $M_z$. Due to longitudinal relaxation, longitudinal magnetization will increase to return to its initial value, passing through a null value. To measure the signal, an RF excitation pulse, which may have a flip angle of ninety or less, is applied to obtain transverse magnetization. The delay between the 180 degree RF inversion pulse and the RF excitation pulse is referred to as the inversion time ("TI"). Since longitudinal relaxation is characterized by the T1 relaxation time, IR pulse sequences can advantageously yield T1-weighted images.

One IR PR method, described in U.S. Pat. No. 8,112,145, allows for the inversion recovery pulse sequence to employ a TI that is established retrospectively. More specifically, MRI data is acquired by repeating a pulse sequence in which MRI data are acquired continuously for an interval of time following application of an inversion RF pulse by acquiring a series of projections to sample different trajectories in k-space. By acquiring interleaved projections using a projection reconstruction pulse sequence over a time span following each inversion RF pulse, k-space image data sets can be formed by retrospectively selecting projections acquired at different delay times TI. The delay time which provides the optimal image contrast can, thus, be determined after the scan is performed.

Figure 2A:
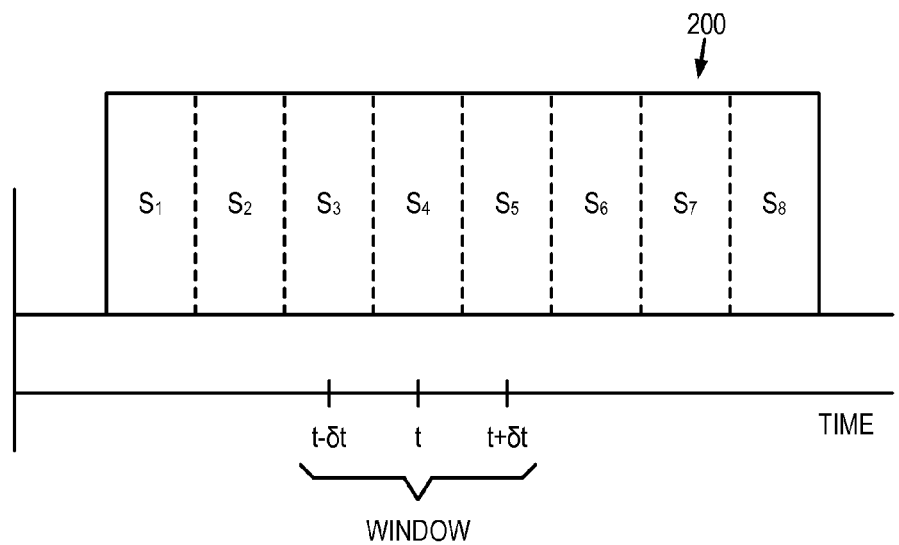
FIG. 2A is a graphic illustration of a magnetic resonance data acquisition using an inversion recovery imaging scheme that acquires data using two-dimensional radial projections associated with predefined segments of data.
Figure 2B:
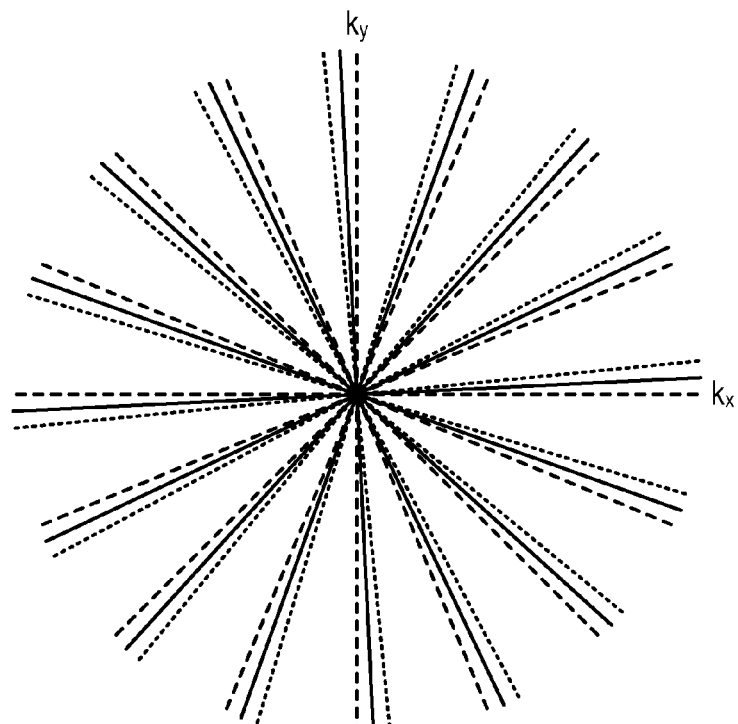
FIG. 2B is a graphic illustration of a two-dimensional k-space sampling pattern implemented to acquire three of the segments illustrated in the inversion recovery imaging scheme of FIG. 2A.

Specifically, referring to FIG. 2A, an example of such an IR PR pulse sequence that allows retrospective selection of TI can be described. In this approach, k-space data is acquired by sampling a plurality of equally-spaced two-dimensional radial projections in k-space in each of a plurality of different, consecutive segments, $S_n$. By way of example, such an acquisition may include the acquisition of eight segments, $S_1, \ldots, S_8$ with each segment including sampling k-space along eight two-dimensional radial projections. The eight radial projections sampled in each of segment are rotated with respect to each other, such that the points in k-space that are sampled in consecutive segments are interleaved to sample k-space as uniformly as possible. As an example, the k-space sampling patterns for segments $S_3$, $S_4$, and $S_5$ are illustrated in FIG. 2B. Peripheral k-space is thus sampled more thoroughly and streak artifacts are substantially reduced. A highly-undersampled image may be reconstructed from one segment; however, due to the undersampling, particularly in peripheral k-space, the resultant image will contain streak artifacts.

Referring particularly to FIG. 2A, image quality can be improved by advantageously combining data acquired during consecutive segments. As indicated above, eight projections are acquired during each segment, $S_1$ through $S_8$, with, for example, a twenty millisecond duration for each segment. In addition, the projections in segments $S_1$ through $S_8$ are interleaved with each other such that no projections sample the same locations in k-space. As a result, a reconstructed image can be improved by combining data from successive segments $S_1$ through $S_8$. For example, it may be determined retrospectively that normal signal from a desired tissue is nulled best by an image reconstructed with data in segment $S_4$, which was acquired at a delay time, t. The k-space sampling of segment $S_4$ is indicated by solid lines 210 in FIG. 2B. To improve image quality, data may also be used from adjacent segments $S_3$ and $S_5$, which are acquired at respective times t−δt and t+δt. The k-space sampling of segment $S_3$ is indicated by dashed lines 212 and the k-space sampling of segment $S_5$ is indicated by dotted lines 214. By interleaving the projections acquired during successive segments $S_1$ through $S_8$, therefore, data from more than one segment can be combined to further reduce k-space undersampling and improve image quality.

Though data acquired during consecutive segments can be combined, the minimum spacing of inversion times that can be retrospectively selected is N times the repetition time ("TR"), where N is the number of projections within each segment and is determined prior to performing data acquisition. In the above example, N=8 and $S_1$ contains projections $P_1$ through $P_8$, with an inversion time, TI, defined as the sum of the time to each projection acquisition, in this case, 1+2+3+4+5+6+7+8 or 36TR, divided by the number of segments, which in the current example, is 8. Thus, the TI of segment $S_1$ is 36TR/8. Segment $S_2$ contains projections $P_9$ through $P_{16}$, with TI defined as 9+10+11+12+13+14+15+16 or 100TR divided by the number of segments, or 100TR/8. The difference in TI between the two segments is 64TR/8, which is equal to 8TR, or, generically, N×TR. Thus, a resolution of less than N×TR cannot be achieved using this method without large uneven gaps between adjacent projections of k-space within a given segment.

As a consequence, although the above-described projection reconstruction technique is highly advantageous, it requires the clinician to prospectively determine the number of projections, N, per segment before data acquisition. Thus, while projections from consecutive segments can be combined, the total number of projections per segment and number of segments is determined prior to data acquisition. Furthermore, the number of segments is inherently tied to the spacing of a given TR. Accordingly, if, for example, the clinician selects the number of projections within a segment, N, such that preferred contrast information is split between multiple segments, the clinician must attempt to retrospectively combine data acquired from across those segments to yield the desired images.

Furthermore, extending the above techniques to three-dimensional imaging acquisitions can be difficult. For example, in the above example, the total number of projections acquired per segment is equal to N multiplied by the number of inversions. In order to acquire a sufficient number of total projections to sample data in three dimensions, either N must be sufficiently large to accommodate a large number of projections per segment, or the number of inversions would have to be sufficiently large to acquire data in all three directions. Since scan time is proportional to the number of inversions, it is more clinically practical to make N large than to extend the overall duration of the scan to accommodate a large number of inversions. However, when N is large, the above-described technique produces few images along the magnetization recovery curve. In practice, thus, a three-dimensional acquisition using the above-described technique may yield only a few images and have decreased clinical utility.

The present invention overcomes the aforementioned drawbacks by providing a system and method for two-dimensional or three-dimensional inversion-recovery magnetic resonance imaging that allows improved flexibility in creating segments and spacing TRs. In accordance with the present invention, any number of consecutive projections can be combined to improve image quality and the number of consecutive projections to be combined can be chosen after data acquisition to retrospectively combine data. Furthermore, the set of a desired number of projections can be selectively adjusted by a single TR, allowing the inversion time to still be adjusted by a given, even single, TR. Multiple sequential TRs thus have increasing inversion times. It is noted that the transverse magnetization prior to each excitation can be spoiled using, for example, variable RF phase or gradient pulses; although, magnetization spoiling is not essential. The choice of whether to use spoiling, however, will affect image contrast.

By way of example, a clinician may choose to use eight consecutively acquired projections to reconstruct an image. If so, these projections are combined together as a data segment, $S_1$. Because this segment includes projections $P_1$ through $P_8$, its average inversion time, TI, is determined by 1+2+3+4+5+6+7+8, or 36TR, divided by 8. If the clinician then selected projections $P_2$ through $P_9$ as the next data segment, $S_2$, this next data segment will have a TI determined by 2+3+4+5+6+7+8+9, or 44TR, divided by 8. Notably the TI spacing of 44TR/8-36TR/8 is equal to 8TR/8, which is the TR between each data frame.

Figure 3A:
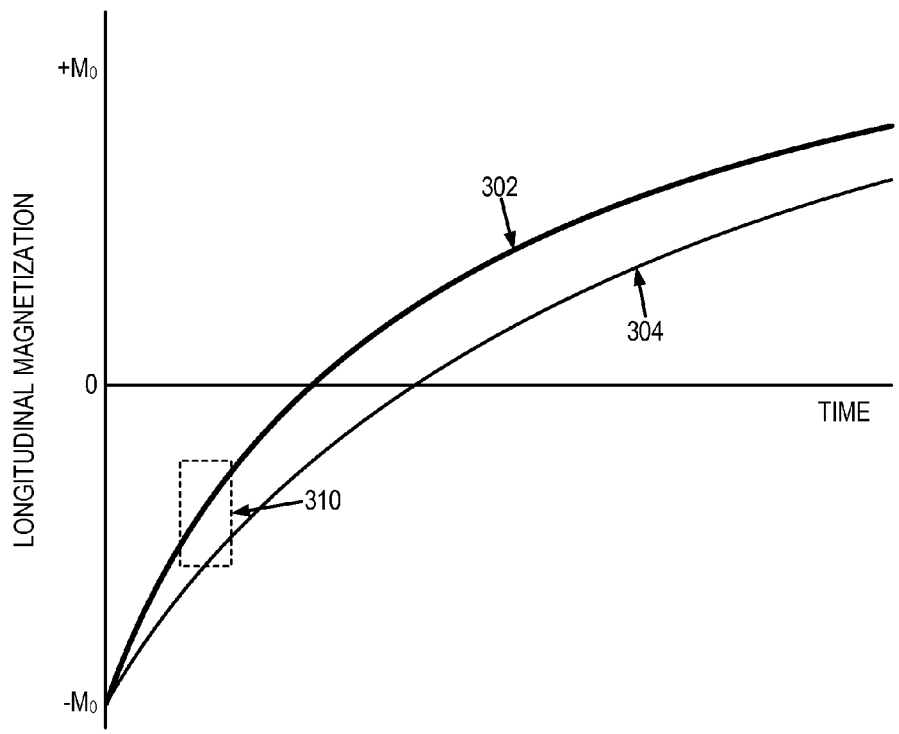
FIG. 3A is an illustration of longitudinal magnetization recovery curves for two different tissue types, such as white matter and gray matter.
Figure 3B:
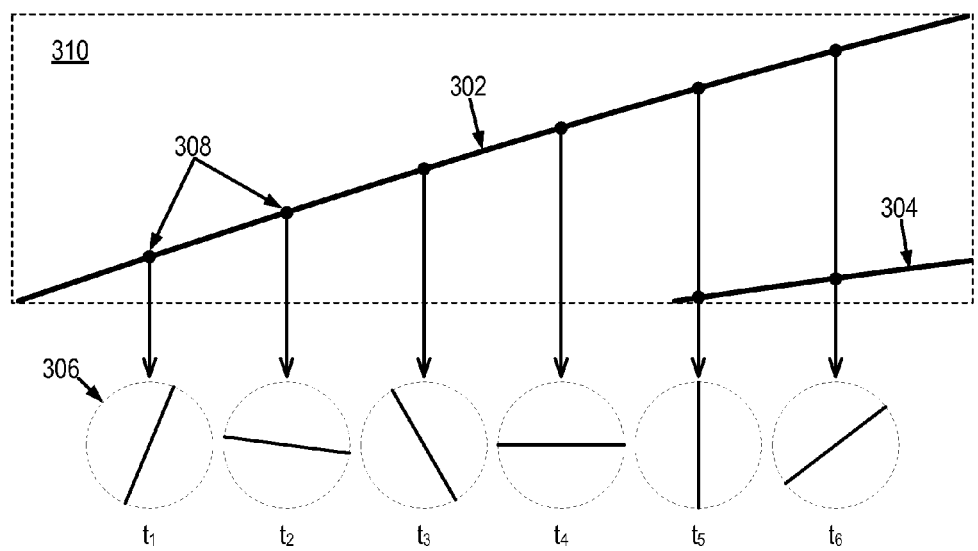
FIG. 3B is an illustration of the sampling scheme implemented in the present invention for sampling k-space while longitudinal magnetization is recovering back to equilibrium.

An example of this data acquisition scheme is illustrated in FIGS. 3A and 3B. In FIG. 3A, the magnetization recovery curves 302, 304 for two different tissue types following the application of an IR pulse are illustrated. By way of example, curve 302 may correspond to white matter and curve 304 may correspond to gray matter. Data is acquired as a series of consecutive radial projections, either in two-dimensions or, preferably, in three-dimensions. As illustrated in FIG. 3B, data may be acquired by sampling k-space along a single projection 306 at each temporal sampling point, $t_n$, 308. FIG. 3B illustrates an example of data acquired during a particular time window 310.

Advantageously, the view ordering used during data acquisition is selected such that subsets of consecutively acquired projections substantially uniformly sample three-dimensional k-space during a time window 310 of any suitable duration. As a result, any subset of consecutively acquired projections can be selected as a data segment while still maintaining a uniform sampling of k-space. This flexibility allows for finer temporal resolution than achievable with previous projection-based IR imaging methods. For instance, temporal resolutions on the order of five milliseconds are obtainable with the present invention.

Figure 4:
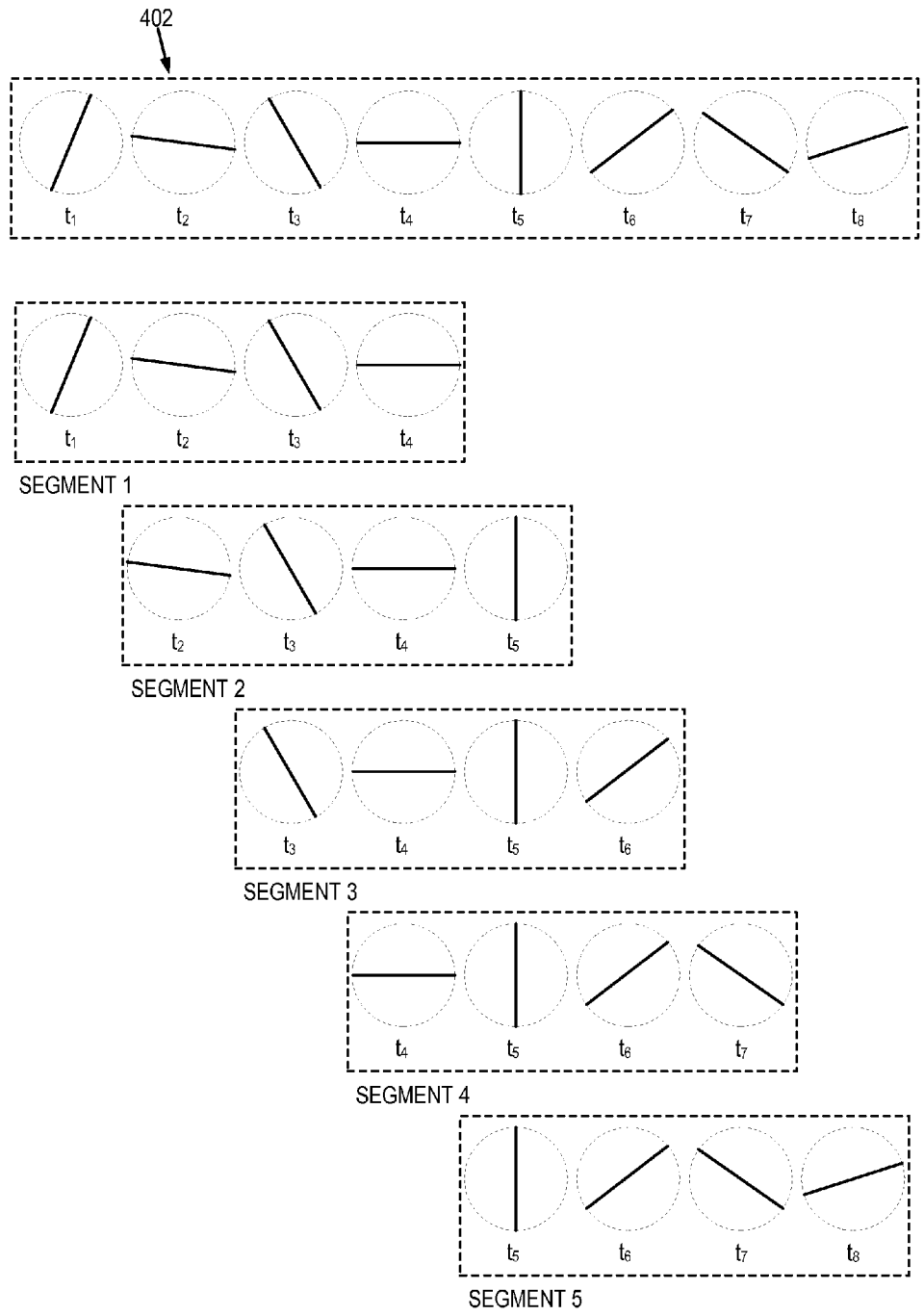
FIG. 4 is an illustration of the grouping of consecutively acquired radial projections into data segments that are temporally shifted by a selected time shift, such as one repetition time period.

As noted above, images are reconstructed from those projections contained within a sliding temporal window that can be selected by the user after data acquisition has occurred. This process is illustrated in FIG. 4 for a series of eight consecutive projections 402 acquired at time points $t_1, \ldots, t_8$ and with a temporal window that includes four projections. In general, the temporal window can be slid one TR period for each image to be reconstructed, as is illustrated in FIG. 4 and described above. This advantageous feature of the present invention allows for the reconstruction of a time series of images that depict changing image contrast as longitudinal magnetization recovers following the application of one or more IR pulses with high temporal resolution. Because these images can be reconstructed with such a fine temporal resolution, the images may be referred to as a "spectrum of images" that span a range of unique image contrasts.

Figure 5A:
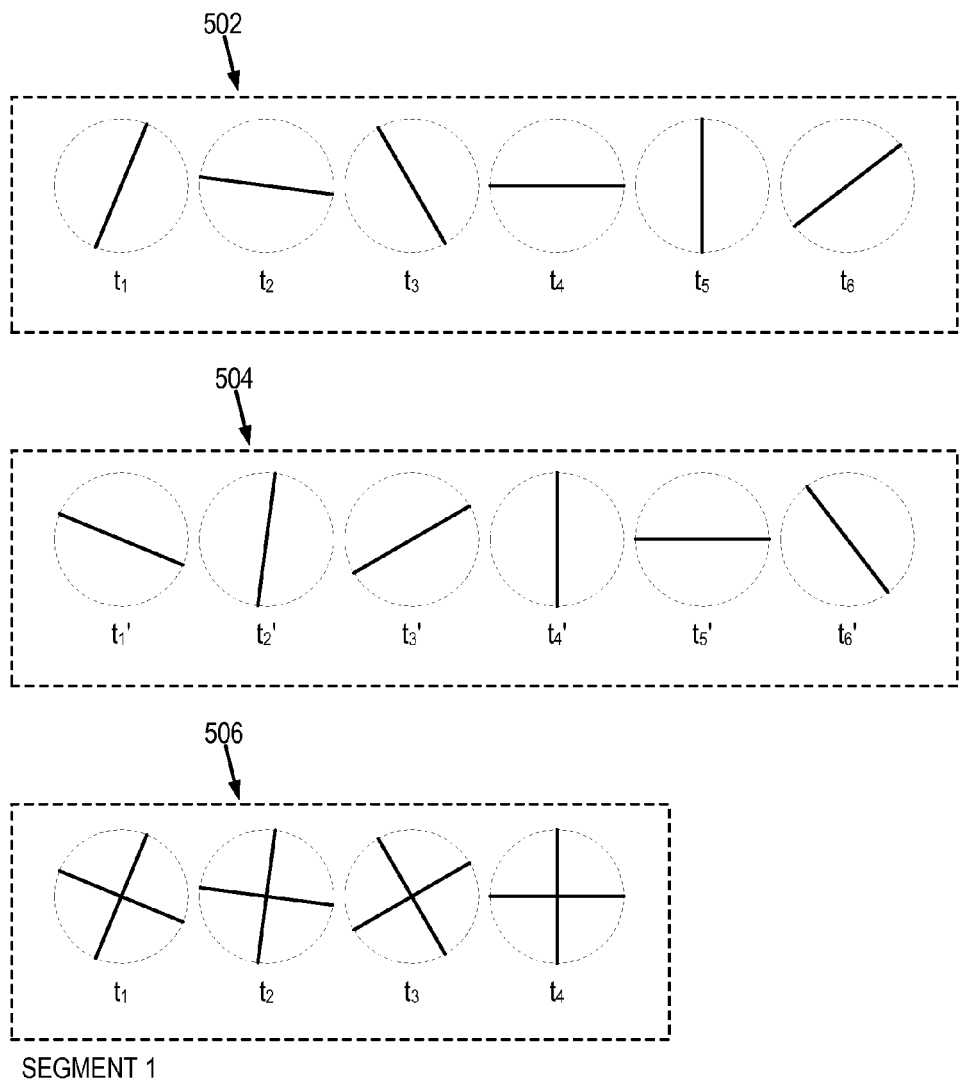
FIG. 5A is an illustration of combining data segments from two different IR pulse sequences.

Multiple inversion recovery sequences can also be performed, with the sampling between repetitions differing, as illustrated in FIG. 5A. Advantageously, data from the equivalent time points in these multiple data acquisitions can be combined to improve the quality of the images reconstructed. For instance, as illustrated in FIG. 5A, data during the first acquisition 502 can be later combined with data from the second acquisition 504 to form a data segment 506. In this instance, the data from time points $t_1$ and $t_1'$ are combined, the data from time points $t_2$ and $t_2'$ are combined, the data from $t_3$ and $t_3'$ are combined, and the data from time points $t_2$ and $t_4'$ are combined.

Figure 5B:
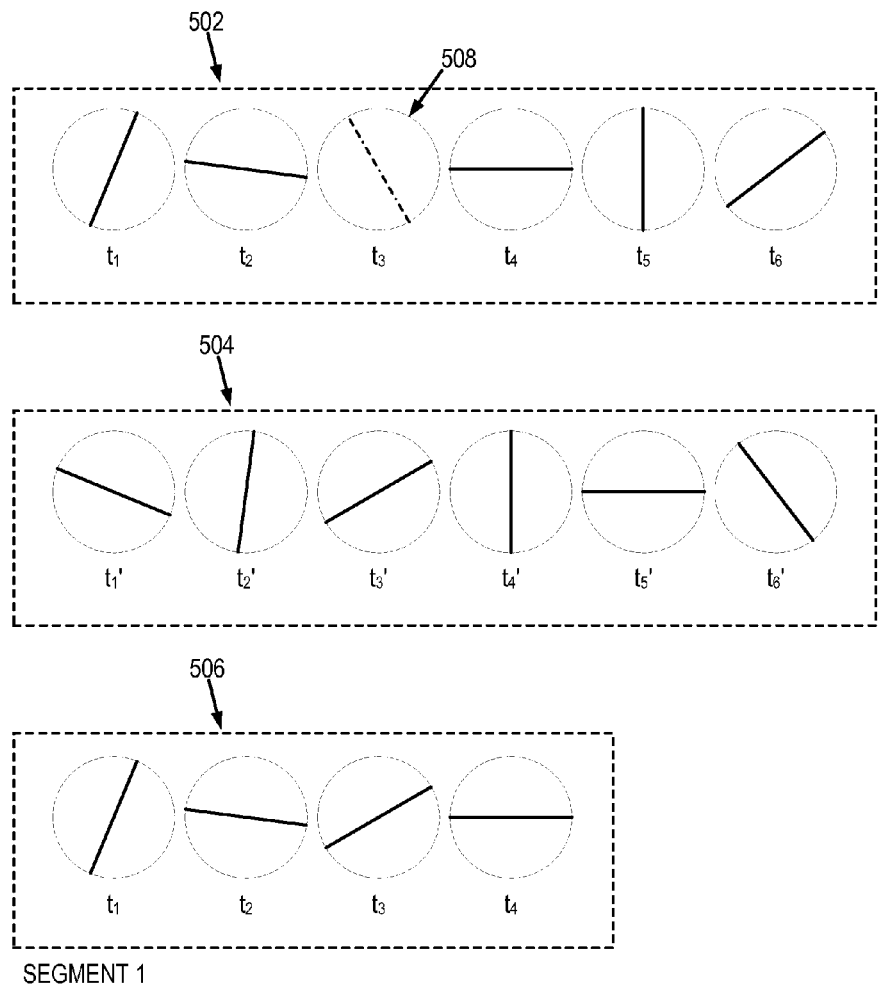
FIG. 5B is an illustration of replacing corrupted data in a data segment formed from a first IR pulse sequence with data in a data segment formed from a second IR pulse sequence.

Also, as illustrated in FIG. 5B, when there is a corrupted projection, such as projection 508 acquired at time $t_3$ from one inversion recovery acquisition, then the projection from the corresponding time point in the second inversion recovery acquisition, such as the projection acquired at time point $t_3'$, can be substituted for the corrupt data. An example of corrupted data includes motion-corrupted data.

Figure 6:
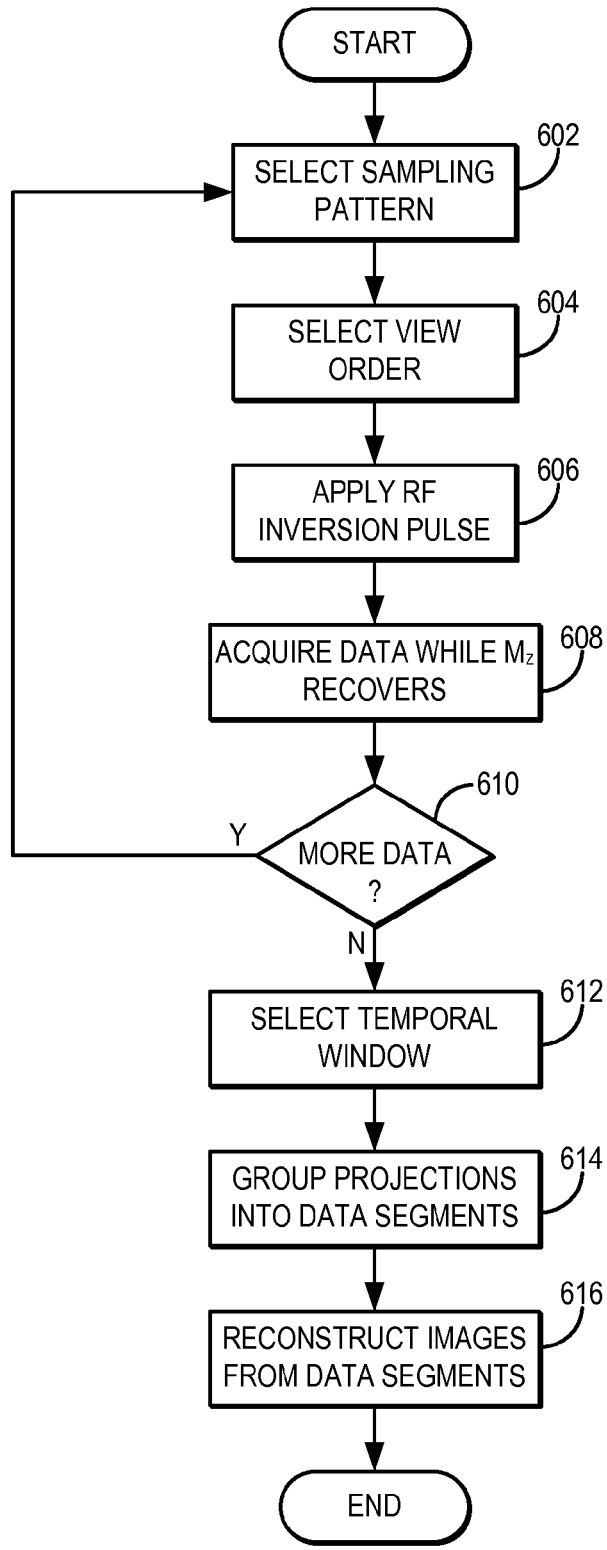
FIG. 6 is a flowchart setting forth the steps of an example of a method for performing radial acquisition inversion-recovery magnetic resonance imaging ("MRI")
Figure 7:
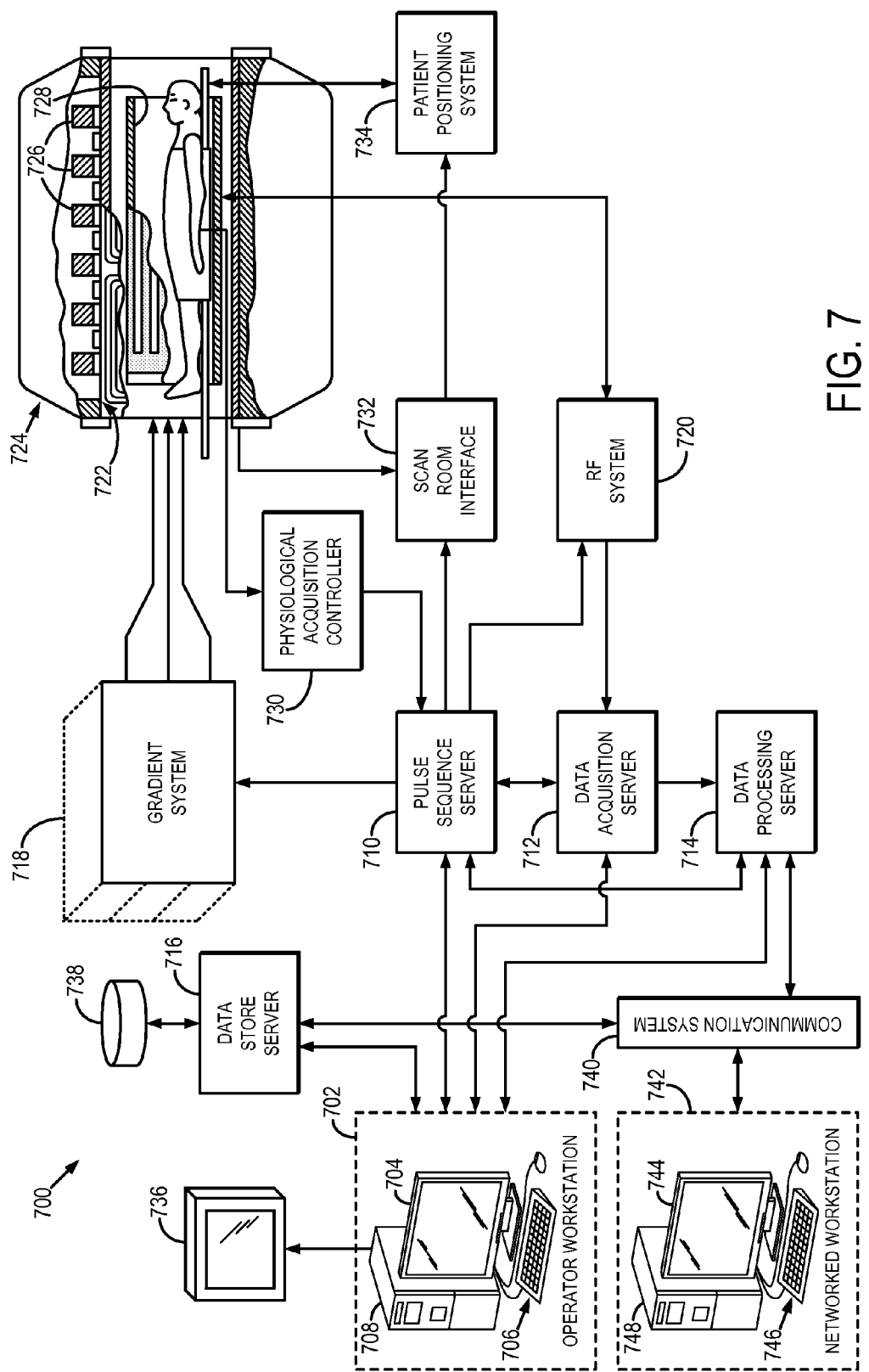
FIG. 7 is a block diagram of an example of an MRI system that can implement the present invention.

Referring now to FIG. 6, a flowchart setting forth the steps of an example of a method for performing radial acquisition inversion-recovery magnetic resonance imaging is illustrated. The method includes directing an MRI system to perform at least one inversion recovery pulse sequence with a two-dimensional or three-dimensional data acquisition that samples k-space at a series of radial projections. The method thus begins with the selection of the k-space sampling pattern to be used to acquire data, as indicated at step 602. By way of example, the sampling pattern includes a plurality of radial projections, which may be two-dimensional radial projections or three-dimensional radial projections. For instance, the sampling pattern could be defined in accordance with so-called vastly undersampling isotropic projection ("VIPR") imaging schemes. Then, as indicated at step 604, the view ordering used for this sampling pattern is selected. This view ordering is selected such that for any group of consecutively acquired radial projections containing at least a selected number of radial projections, those radial projections will be substantially uniformly distributed in k-space.

After the sampling pattern and view order have been initialized, imaging begins. In particular, imaging begins with the application of an inversion recovery ("IR") RF pulse to the subject being imaged, as indicated at step 606. Then, while longitudinal magnetization, $M_z$, is recovering back to equilibrium following the application of the IR RF pulse, k-space data is acquired from the subject in accordance with the selected sampling pattern and view ordering, as indicated at step 608. By way of example, k-space data is acquired as described above; namely, by sampling k-space along a radial projection during a single TR period. A series of consecutive radial projections are sampled in this manner. Preferably, the radial projections are selected such that a selected number of consecutive radial projections substantially uniformly sample two-dimensional or three-dimensional k-space.

After the k-space data are acquired, a determination is made whether additional data should be acquired, as indicated at decision block 610. For example, it may be desirable to acquire more k-space data to sample a second recovery curve. Such subsequent data acquisitions may sample k-space using the same k-space sampling pattern using the same view order as used in the first or other prior data acquisitions; however, the sampling pattern and view ordering can also be changed.

After all of the desired k-space data have been acquired, a temporal window is selected, as indicated at step 612. This temporal window defines how many consecutively acquired projections should be included from each k-space data set when reconstructing an image. The data are grouped into data segments using the selected temporal window, as indicated at step 614. For instance, a selected number of consecutive projections are grouped into a data segment. The number of projections included in each data segment is determined by the selected temporal window, which can be defined based on the desired temporal resolution for the image reconstruction. As described above, preferably the data are grouped into data segments that are temporally shifted by only a single TR period. Thus, each data segment can be defined by an initial radial projection acquired at an initial time point and by the desired number of radial projections to be included in each data segment. After the k-space data have been grouped into data segments, images are reconstructed from the data segments, as indicated at step 616. A time series of images that depicts the subject as longitudinal magnetization recovers following the application of the one or more inversion recovery RF pulses is thus formed. Each image in this time series has a unique image contrast that is determined by the recovery state of the longitudinal magnetization at which the data in the associated data segment were acquired.

Because this time series of images can be designed to span almost the entirety of the longitudinal magnetization recovery curve, it is not necessary to prospectively select an inversion time to obtain an image in which signals attributable to a specific tissue are nulled or when contrast between two different tissues is maximized. Rather, because of the high temporal resolution of the method of the present invention, such an image can be retrospectively identified in the time series or spectrum of images. This feature is highly advantageous for pediatric imaging where the precise inversion time for a child patient may not be readily known. Because children are rapidly developing, there is no consensus on what inversion time to use to achieve a particular tissue nulling or contrast. The lack of consensus is also due to the fact that children's brains do not develop homogeneously, meaning that no single inversion time may be ideal for a given child's entire head. The present invention thus provides a solution to this problem by allowing the retrospective identification of an image with the optimal tissue contrast.

Referring particularly now to FIG. 9, an example of a magnetic resonance imaging ("MRI") system 900 that can implement the present invention is illustrated. The MRI system 900 includes a workstation 902 having a display 904 and a keyboard 906. The workstation 902 includes a processor 908, such as a commercially available programmable machine running a commercially available operating system. The workstation 902 provides the operator interface that enables scan prescriptions to be entered into the MRI system 900. The workstation 902 is coupled to four servers: a pulse sequence server 910; a data acquisition server 912; a data processing server 914; and a data store server 916. The workstation 902 and each server 910, 912, 914, and 916 are connected to communicate with each other. For example, the servers 910, 912, 914, and 916 may be connected via any suitable network connection, whether wired, wireless, or a combination of both. As an example the suitable network connection may include both proprietary or dedicated networks, as well as open networks, such as the internet.

The pulse sequence server 910 functions in response to instructions downloaded from the workstation 902 to operate a gradient system 918 and a radiofrequency ("RF") system 920. Gradient waveforms necessary to perform the prescribed scan are produced and applied to the gradient system 918, which excites gradient coils in an assembly 922 to produce the magnetic field gradients $G_x$, $G_y$, and $G_z$ used for position encoding MR signals. The gradient coil assembly 922 forms part of a magnet assembly 924 that includes a polarizing magnet 926 and a whole-body RF coil 928.

RF excitation waveforms are applied to the RF coil 928, or a separate local coil (not shown in FIG. 9), by the RF system 920 to perform the prescribed magnetic resonance pulse sequence. Responsive MR signals detected by the RF coil 928, or a separate local coil (not shown in FIG. 9), are received by the RF system 920, amplified, demodulated, filtered, and digitized under direction of commands produced by the pulse sequence server 910. The RF system 920 includes an RF transmitter for producing a wide variety of RF pulses used in MR pulse sequences. The RF transmitter is responsive to the scan prescription and direction from the pulse sequence server 910 to produce RF pulses of the desired frequency, phase, and pulse amplitude waveform. The generated RF pulses may be applied to the whole body RF coil 928 or to one or more local coils or coil arrays (not shown in FIG. 9).

The RF system 920 also includes one or more RF receiver channels. Each RF receiver channel includes an RF preamplifier that amplifies the MR signal received by the coil 928 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (1);$$

and the phase of the received MR signal may also be determined:

$$\varphi = \tan^{-1}\left(\frac{Q}{I}\right). \qquad (2)$$

The pulse sequence server 910 also optionally receives patient data from a physiological acquisition controller 930. The controller 930 receives signals from a number of different sensors connected to the patient, such as electrocardiograph ("ECG") signals from electrodes, or respiratory signals from a bellows or other respiratory monitoring device. Such signals are typically used by the pulse sequence server 910 to synchronize, or "gate," the performance of the scan with the subject's heart beat or respiration.

The pulse sequence server 910 also connects to a scan room interface circuit 932 that receives signals from various sensors associated with the condition of the patient and the magnet system. It is also through the scan room interface circuit 932 that a patient positioning system 934 receives commands to move the patient to desired positions during the scan.

The digitized MR signal samples produced by the RF system 920 are received by the data acquisition server 912. The data acquisition server 912 operates in response to instructions downloaded from the workstation 902 to receive the real-time MR data and provide buffer storage, such that no data is lost by data overrun. In some scans, the data acquisition server 912 does little more than pass the acquired MR data to the data processor server 914. However, in scans that require information derived from acquired MR data to control the further performance of the scan, the data acquisition server 912 is programmed to produce such information and convey it to the pulse sequence server 910. For example, during prescans, MR data is acquired and used to calibrate the pulse sequence performed by the pulse sequence server 910. Also, navigator signals may be acquired during a scan and used to adjust the operating parameters of the RF system 920 or the gradient system 918, or to control the view order in which k-space is sampled. In all these examples, the data acquisition server 912 acquires MR data and processes it in real-time to produce information that is used to control the scan.

The data processing server 914 receives MR data from the data acquisition server 912 and processes it in accordance with instructions downloaded from the workstation 902. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 914 are conveyed back to the workstation 902 where they are stored. Real-time images are stored in a data base memory cache (not shown in FIG. 9), from which they may be output to operator display 912 or a display 936 that is located near the magnet assembly 924 for use by attending physicians. Batch mode images or selected real time images are stored in a host database on disc storage 938. When such images have been reconstructed and transferred to storage, the data processing server 914 notifies the data store server 916 on the workstation 902. The workstation 902 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:

a) selecting a sampling pattern for sampling k-space, the sampling pattern including a plurality of radial projections in k-space;

b) selecting a view order that defines an order in which radial projections in the selected sampling pattern are to be acquired, the view order being selected such that any group of consecutively acquired radial projections will sample k-space in a substantially uniform distribution;

c) directing the MRI system to apply an inversion recovery (IR) radio frequency (RF) pulse to the subject such that net longitudinal magnetization in the subject is substantially inverted and begins to relax back to equilibrium;

d) directing the MRI system to acquire k-space data while the net longitudinal magnetization is recovering back to equilibrium by sampling k-space in accordance with the selected sampling pattern and the selected view order;

e) forming a data segment by grouping together consecutively acquired radial projections in the acquired k-space data starting with an initial radial projection acquired at an initial time point;

f) reconstructing an image of the subject from the data segment formed in step e), the reconstructed image depicting an image contrast defined by a recovery state of the net longitudinal magnetization at which the radial projections in the data segment were acquired.

2. The method as recited in claim 1 in which:

step e) comprises forming a plurality of data segments, each of the plurality of data segments including consecutively acquired radial projections starting with a different initial radial projection acquired at a different initial time point; and step f) comprises reconstructing an image of the subject from each of the plurality of data segments formed in step c), each of the reconstructed images depicting a different image contrast defined by a different recovery state of the net longitudinal magnetization at which the radial projections in the respective data segments were acquired.

3. The method as recited in claim 2 in which plurality of data segments formed in step e) define a time series of data segments such that the initial time point of each consecutive data segment differs by one repetition time period.

4. The method as recited in claim 3 in which the repetition time period is about five milliseconds.

5. The method as recited in claim 4 further comprising calculating a longitudinal relaxation time from the images reconstructed in step f).

6. The method as recited in claim 5 in which the longitudinal relaxation time is calculated by fitting signal values in the images to a signal model.

7. The method as recited in claim 2 in which each of the plurality of data segments includes a same number of radial projections.

8. The method as recited in claim 2 in which:

step b) comprises selecting a first view order and a second view order that is different that the first view order, each view order defining an order in which radial projections in the selected sampling pattern are to be acquired and being selected such that any group of consecutively acquired radial projections containing at least a selected number of radial projections will sample k-space in a substantially uniform distribution; and steps c) and d) are repeated for each view order so as to acquire first k-space data associated with the first view order and second k-space data associated with the second view order.

9. The method as recited in claim 8 in which step e) includes:
- selecting an initial time point;
- selecting first radial projections by selecting a number of consecutively acquired radial projections in the first k-space data starting with a first initial radial projection acquired at the selected initial time point;
- selecting second radial projections by selecting the number of consecutively acquired radial projections in the second k-space data starting with a second initial radial projection acquired at the selected initial time point; and
- combining the first radial projections and the second radial projections.

10. The method as recited in claim 1 in which the sampling pattern selected in step a) includes three-dimensional radial projections that sample k-space in three dimensions.

11. A method for producing a plurality of images that depict a spectrum of different image contrasts using a magnetic resonance imaging system, the steps of the method comprising:
- a) selecting a sampling pattern for sampling k-space, the sampling pattern including a plurality of radial projections in k-space;
- b) selecting a temporal window;
- c) determining a view order that defines an order in which radial projections in the selected sampling pattern are to be acquired using the selected temporal window such that any group of consecutively acquired radial projections contained in the temporal window will substantially uniformly sample k-space;
- d) directing the MRI system to apply an inversion recovery (IR) radio frequency (RF) pulse to the subject such that net longitudinal magnetization in the subject is substantially inverted and begins to relax back to equilibrium;
- e) directing the MRI system to acquire k-space data while the net longitudinal magnetization is recovering back to equilibrium by sampling k-space in accordance with the selected sampling pattern and the selected view order;
- f) forming a data segment by grouping together consecutively acquired radial projections in the acquired k-space data using the selected time window;
- g) repeating step f) to form a plurality of data segments while sliding the temporal window by a selected time shift during each repetition of step f); and
- h) reconstructing a plurality of images that depict a spectrum of different image contrasts from the data segments formed in steps f) and g), the spectrum of different image contrasts being defined by a recovery state of the net longitudinal magnetization at which the radial projections in the data segment associated with a given image were acquired.

12. The method as recited in claim 11 in which the selected time shift is one repetition time period.

13. The method as recited in claim 12 in which the repetition time period is about five milliseconds.

14. The method as recited in claim 11 in which:
- step c) comprises selecting a first view order and a second view order that is different that the first view order, each view order being selected using the selected temporal window such that any group of consecutively acquired radial projections contained in the temporal window will substantially uniformly sample k-space; and
- steps d) and e) are repeated for each view order so as to acquire first k-space data associated with the first view order and second k-space data associated with the second view order.

15. The method as recited in claim 14 in which step f) includes:
- selecting an initial time point;
- selecting first radial projections as those radial projections in the first k-space data acquired starting at the selected initial time point and within the temporal window;
- selecting second radial projections as those radial projections in the second k-space data acquired starting at the selected initial time point and within the temporal window; and
- combining the first radial projections and the second radial projections.

16. The method as recited in claim 11 in which the sampling pattern selected in step a) includes three-dimensional radial projections that sample k-space in three dimensions.

* * * * *